(12) United States Patent
Kushnir et al.

(10) Patent No.: US 12,489,085 B2
(45) Date of Patent: Dec. 2, 2025

(54) C2C YIELD AND PERFORMANCE OPTIMIZATION IN A DIE STACKING PLATFORM

(71) Applicant: Mellanox Technologies, Ltd., Yokneam (IL)

(72) Inventors: Igal Kushnir, Hod Hasharon (IL); Ayal Eshkoli, Kiryat Tivon (IL)

(73) Assignee: Mellanox Technologies, Ltd., Yokneam (IL)

( * ) Notice: Subject to any disclaimer, the term of this patent is extended or adjusted under 35 U.S.C. 154(b) by 560 days.

(21) Appl. No.: 17/895,353

(22) Filed: Aug. 25, 2022

(65) Prior Publication Data

US 2024/0071994 A1     Feb. 29, 2024

(51) Int. Cl.
*H01L 25/065* (2023.01)
*H01L 23/00* (2006.01)
*H01L 23/48* (2006.01)

(52) U.S. Cl.
CPC ........ *H01L 25/0652* (2013.01); *H01L 23/481* (2013.01); *H01L 24/16* (2013.01); *H01L 2224/16225* (2013.01)

(58) Field of Classification Search
None
See application file for complete search history.

(56) References Cited

U.S. PATENT DOCUMENTS

| | | | | |
|---|---|---|---|---|
| 8,880,968 | B2 * | 11/2014 | Whetsel | G01R 31/318533 714/724 |
| 10,101,385 | B2 * | 10/2018 | Whetsel | G01R 31/318533 |
| 11,333,703 | B2 * | 5/2022 | Whetsel | G01R 31/3177 |
| 11,860,224 | B2 * | 1/2024 | Whetsel | G01R 31/2884 |
| 2018/0341431 | A1 * | 11/2018 | Hirobe | H01L 25/0657 |
| 2023/0305982 | A1 * | 9/2023 | Schulz | H01L 25/0655 |

* cited by examiner

*Primary Examiner* — Long Pham
(74) *Attorney, Agent, or Firm* — Lowenstein Sandler LLP

(57) ABSTRACT

Technologies for chip-to-chip (C2C) yield and performance optimization in a die stacking platform are described. One apparatus includes a substrate, a first integrated circuit disposed on the substrate at a first location, a second integrated circuit disposed on the substrate at a second location, and a third integrated circuit disposed on the second integrated circuit. The second integrated circuit is coupled to the first integrated circuit using a first chip-to-chip (C2C) interface via a physical terminal. The third integrated circuit is coupled to the first integrated circuit using a second C2C interface via the physical terminal. Only one of the first C2C interface and the second C2C interface is active at a time.

19 Claims, 7 Drawing Sheets

C2C YIELD AND PERFORMANCE OPTIMIZATION IN A DIE STACKING PLATFORM

TECHNICAL FIELD

At least one embodiment pertains to a chip-to-chip (C2C) serializer and deserializer (SERDES) apparatus. For example, at least one embodiment pertains to C2C yield and performance optimization in a die stacking platform.

BACKGROUND

In the data processing field, integrated circuits (dies) are fabricated on a semiconductor material such as electronic-grade silicon. The dies are manufactured with functional circuitry that can function as microcontrollers, microprocessors, logic gates, computer memory, and the like. The dies are placed within a package on top of a printed circuit board (PCB) and can communicate with each other via electrical connections within the substrate. As semiconductor manufacturing technologies continue to improve, the size of the dies continues to decrease.

One technology that has been developed to maximize the available die capabilities, while keeping up with the decreasing die size is called die stacking. Die stacking refers to the process of stacking two or more dies on top of each other within a single semiconductor package. In stacked die platforms, a first die (or primary die) is connected to a substrate within the semiconductor package, and subsequent dies are stacked on top. The first die is connected via solder bumps or other forms of connection to the substrate. The solder bumps can also be connected to peripheral devices to allow for communication between the stacked dies and the peripheral devices. The communication between the stacked dies and the peripheral devices is done via a C2C (chip to chip) serializer and deserializer (SERDES). Die stacking can significantly increase the number of dies used within a single package while conserving the available area on the substrates. When dies are stacked, rather than placed side by side, the electrical connections between dies and other circuitry can be shortened, which can result in faster signal propagation and noise and cross-talk reduction, therefore resulting in better electrical performance of the device.

Large platforms implementing die stacking technologies may use thousands of C2C links between the different dies. As such, platform failure or limited performance due to a single C2C input/output (C2C I/O) is common. This can be due to mechanical or assembly failure (e.g., soldering disconnections), electrical failure (e.g., silicon defects), or the like. Thus, C2C yield and optimization improvements to address platform failure are desired.

BRIEF DESCRIPTION OF DRAWINGS

Various embodiments in accordance with the present disclosure will be described with reference to the drawings, in which.

DETAILED DESCRIPTION

Technologies for C2C yield and performance optimization in a die stacking platform are described. As described above, large platforms implementing die stacking technologies may use thousands of C2C links between the different dies, making platform failure or limited performance due to a single C2C I/O common. Conventionally, there are two types of solutions to overcome C2C I/O failure or limited performance. The first solution is used by incorporating redundant C2C I/Os into the silicon of each die (also known as lane repair). Using this method, failing C2C I/Os are disabled and redundant C2C I/Os are activated within the dies to take the place of the failing C2C I/Os. The second solution is used by periodically calibrating and optimizing the C2C I/O performance (e.g., calibrating C2C I/Os in order to overcome aging or slow temperature variations that might lead to high bit error ratios (BERs)). In using the first solution, adding redundant C2C I/Os to the silicon of each die may lower the overall throughput of the C2C interconnect solution. Therefore, there is a tradeoff between the throughput and yield, constraining the platform yield. In using the second solution, the calibration has to be performed in either a very short time or in the background, since there are C2C standards (such as high bandwidth interconnect (HBI) standards) that operate continuously and prevent link stoppage for calibration.

Aspects and embodiments of the present disclosure address these and other challenges by providing a die configuration on a substrate to optimize C2C yield and performance. Aspects and embodiments of the present disclosure can provide integrated circuits disposed on a substrate. A first integrated circuit can be disposed on the substrate at a first location. A second integrated circuit can be disposed on the substrate at a second location. A third integrated circuit can be disposed on the second integrated circuit. The second and third integrated circuits can each comprise a C2C interface. The C2C interfaces of the second and third integrated circuits can be coupled to the first integrated circuit via a physical terminal. Only one of the C2C interfaces of the second and third integrated circuits can be active at a time. The configuration of the integrated circuits and the C2C interfaces can enable high platform yield and performance compared to conventional systems.

Figure 1A:
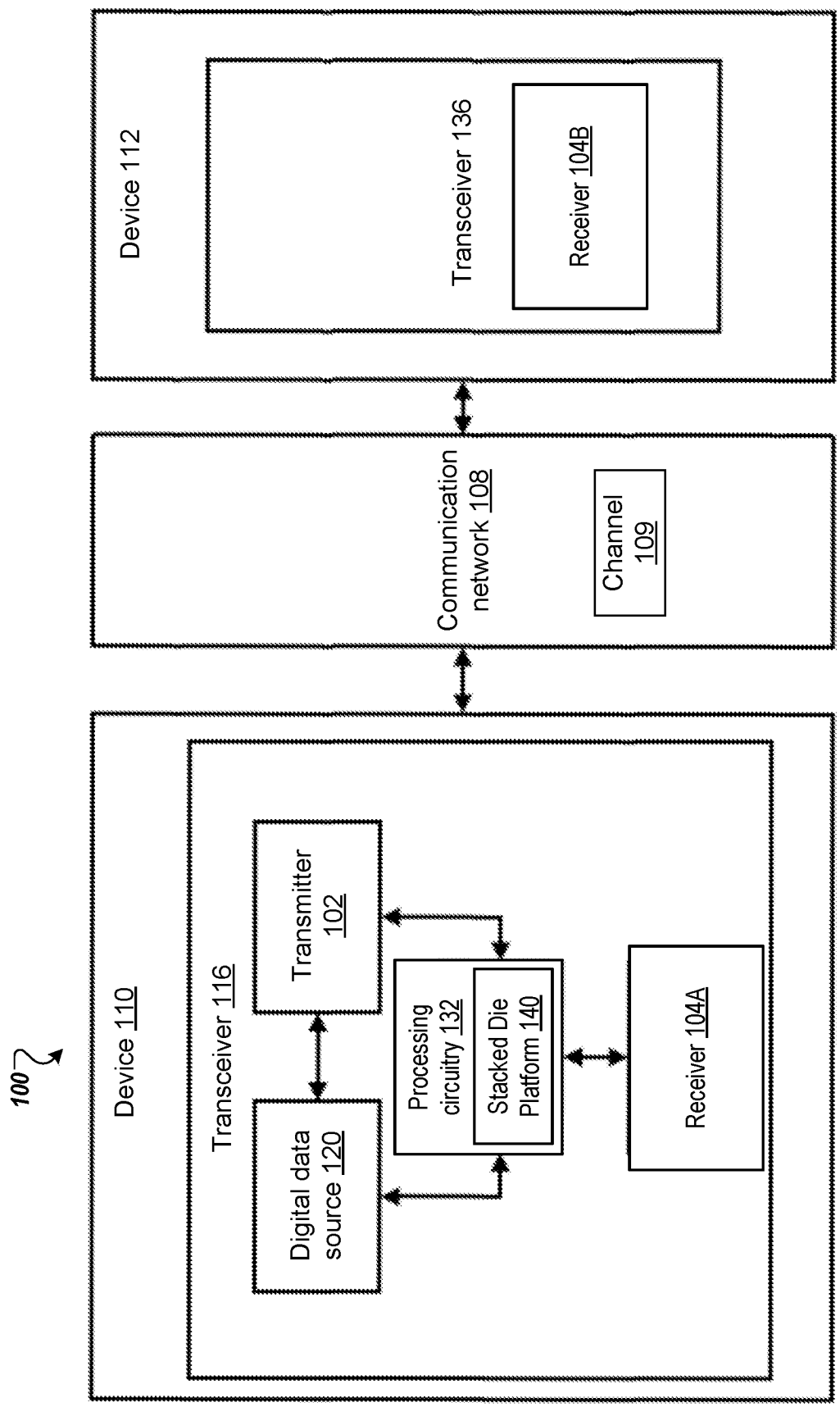
FIG. 1A illustrates an example communication system with a stacked die platform, in accordance with at least one embodiment.

FIG. 1A illustrates an example communication system 100 with a stacked die platform 140, in accordance with at least some embodiments. The system 100 includes a device 110, a communication network 108 including a communication channel 109, and a device 112. In at least one example embodiment, devices 110 and 112 correspond to one or more of a Personal Computer (PC), a laptop, a tablet, a smartphone, a server, a collection of servers, or the like. In some embodiments, the devices 110 and 112 may correspond to any appropriate type of device that communicates with other devices also connected to a common type of communication network 108. According to embodiments, the receiver 104A, 104B of devices 110 or 112 may correspond to a graphics processing unit (GPU), a switch (e.g., a high-speed network switch), a network adapter, a central processing unit (CPU), a data processing unit (DPU), etc. As another specific but non-limiting example, the devices 110 and 112 may correspond to servers offering information resources, services, and/or applications to user devices, client devices, or other hosts in the system 100.

Examples of the communication network 108 that may be used to connect the devices 110 and 112 include an Internet Protocol (IP) network, an Ethernet network, an InfiniBand (IB) network, a Fibre Channel network, the Internet, a cellular communication network, a wireless communication network, combinations thereof (e.g., Fibre Channel over Ethernet), variants thereof, and/or the like. In one specific, but non-limiting example, the communication network 108 is a network that enables data transmission between the devices 110 and 112 using data signals (e.g., digital, optical, wireless signals).

The device 110 includes a transceiver 116 for sending and receiving signals, for example, data signals. The data signals may be digital or optical signals modulated with data or other suitable signals for carrying data.

The transceiver 116 may include a digital data source 120, a transmitter 102, a receiver 104A, and processing circuitry 132 that controls the transceiver 116. The digital data source 120 may include suitable hardware and/or software for outputting data in a digital format (e.g., in binary code and/or thermometer code). The digital data output by the digital data source 120 may be retrieved from memory (not illustrated) or generated according to input (e.g., user input).

The transmitter 102 includes suitable software and/or hardware for receiving digital data from the digital data source 120 and outputting data signals according to the digital data for transmission over the communication network 108 to a receiver 104B of device 112.

The receiver 104A, 104B of device 110 and device 112 may include suitable hardware and/or software for receiving signals, for example, data signals from the communication network 108. For example, the receivers 104A, 104B may include components for receiving processing signals to extract the data for storing in a memory.

The processing circuitry 132 may comprise software, hardware, or a combination thereof. In at least one embodiment, the processing circuitry 132 includes the stacked die platform 140. The stacked die platform 140 includes a substrate, a first integrated circuit disposed on the substrate at a first location, a second integrated circuit disposed on the first integrated circuit, and peripheral integrated circuits disposed at various locations on the substrate. The first integrated circuit is coupled to one or more of the peripheral integrated circuits using at least a first chip-to-chip (C2C) interface via a physical terminal. The second integrated circuit is coupled to one or more of the peripheral integrated circuits using at least a second C2C interface via the physical terminal. Only one of the first C2C interface and the second C2C interface is active at a time. For example, the first integrated circuit and the second integrated circuit may make up one or more of an Integrated Circuit (IC) chip, a CPU, a GPU, a DPU, a microprocessor, a Field Programmable Gate Array (FPGA), or the like. The peripheral integrated circuits may make up one or more peripheral devices including serial interfaces, parallel input-output devices, hardware controllers, or the like. Additional details of the stacked die platform 140 are discussed in more detail below with reference to the figures. For example, the processing circuitry 132 may include a memory including executable instructions and a processor (e.g., a microprocessor) that executes the instructions on the memory. The memory may correspond to any suitable type of memory device or collection of memory devices configured to store instructions. Non-limiting examples of suitable memory devices that may be used include Flash memory, Random Access Memory (RAM), Read Only Memory (ROM), variants thereof, combinations thereof, or the like. In some embodiments, the memory and processor may be integrated into a common device (e.g., a microprocessor may include integrated memory). Additionally, or alternatively, the processing circuitry 132 may comprise hardware, such as an application-specific integrated circuit (ASIC). Other non-limiting examples of the processing circuitry 132 include an Integrated Circuit (IC) chip, a CPU, a GPU, a DPU, a microprocessor, a Field Programmable Gate Array (FPGA), a collection of logic gates or transistors, resistors, capacitors, inductors, diodes, or the like. Some or all of the processing circuitry 132 may be provided on a Printed Circuit Board (PCB) or collection of PCBs. Additionally, it should be appreciated that any other appropriate type of electrical component or collection of electrical components may be suitable for inclusion in the processing circuitry 132. The processing circuitry 132 may send and/or receive signals to and/or from other elements of the transceiver 116 to control the overall operation of the transceiver 116.

The transceiver 116 or selected elements of the transceiver 116 may take the form of a pluggable card or controller for the device 110. For example, the transceiver 116 or selected elements of the transceiver 116 may be implemented on a network interface card (NIC).

The device 112 may include a transceiver 136 for sending and receiving signals, for example, data signals over a channel 109 of the communication network 108. The same or similar structure of the transceiver 116 may be applied to transceiver 136, and thus, the structure of transceiver 136 is not described separately.

Although not explicitly shown, it should be appreciated that devices 110 and 112 and the transceivers 116 and 136 may include other processing devices, storage devices, and/or communication interfaces generally associated with computing tasks, such as sending and receiving data.

Figure 1B:
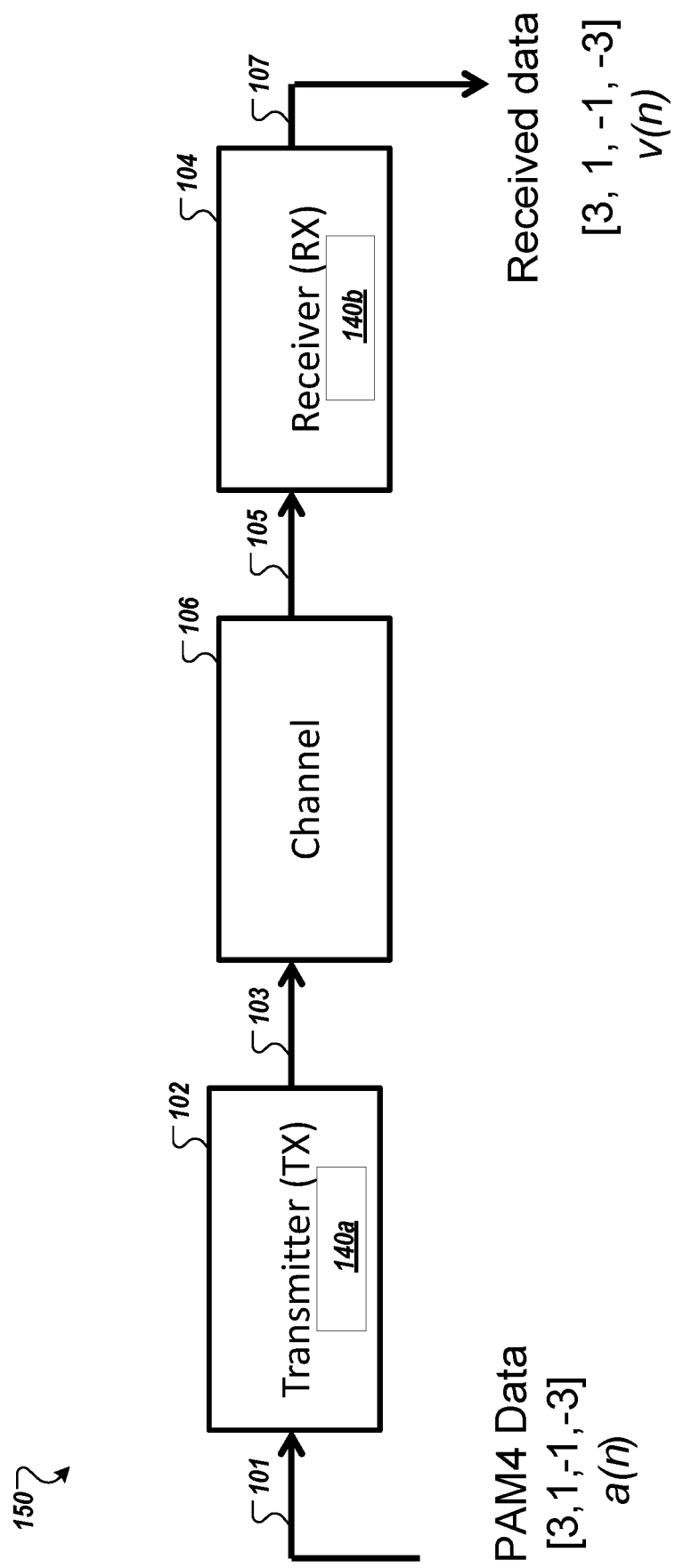
FIG. 1B is a block diagram of a communication system employing a stacked die platform in a transmitter and a receiver, according to at least one embodiment.

FIG. 1B illustrates a block diagram of an example communication system 150 employing stacked die platforms 140a-b in a transmitter 102 and a receiver 104, according to at least one embodiment. In the example shown in FIG. 1B, a PAM level-4 (PAM4) modulation scheme is employed with respect to the transmission of a signal (e.g., digitally encoded data) from the transmitter (TX) 102 to a receiver (RX) 104 via a communication channel 106 (e.g., a transmission medium). In this example, the transmitter 102 receives 101 an input data (i.e., the input data at time n is represented as "a(n)"), which is modulated in accordance with a modulation scheme (e.g., PAM4) and sends the signal 103 a(n) including a set of data symbols (e.g., symbols −3, −1, 1, 3, wherein the symbols represent coded binary data). It is noted that while the use of the PAM4 modulation scheme is described herein by way of example, other data modulation schemes can be used in accordance with embodiments of the present disclosure, including, for example, a non-return-to-zero (NRZ) modulation scheme, PAM7, PAM8, PAM16, etc. For example, for an NRZ-based system, the transmitted data symbols consist of symbols −1 and 1, with each symbol value representing a binary bit. This is also known as a PAM level-2 or PAM2 system as there are two unique values of transmitted symbols. Typically, a binary bit 0 is encoded as −1, and a bit 1 is encoded as 1, as the PAM2 values.

In the example shown, the PAM4 modulation scheme uses four (4) unique values of transmitted symbols to achieve higher efficiency and performance. The four levels are denoted by symbol values −3, −1, 1, 3, with each symbol representing a corresponding unique combination of binary bits (e.g., 00, 01, 10, 11).

The communication channel 106 is a destructive medium in that the channel acts as a low pass filter which attenuates higher frequencies more than it attenuates lower frequencies, introduces inter-symbol interference (ISI) and noise from cross talk, power supplies, Electromagnetic Interference (EMI), or other sources. The communication channel 106 can be over serial links (e.g., a cable, printed circuit boards (PCBs) traces, copper cables, optical fibers, or the like), read channels for data storage (e.g., hard disk, flash solid-state drives (SSDs), high-speed serial links, deep space satellite communication channels, applications, or the like.

As described above, in some communication systems, the transmitter 102 sends the signal 103 as a data signal without a transmitter clock used to generate the data signal. The receiver (RX) 104 receives an incoming signal 105 over the channel 106. The stacked die platforms 140a-b can be used to make up the electrical circuitry in the transmitter 102 and the receiver 104 as described herein. For example, the stacked die platforms 140a-b may replace conventional circuitry that would conventionally make up the electrical circuitry in the transmitter 102 and the receiver 104 as described herein.

Figure 2:
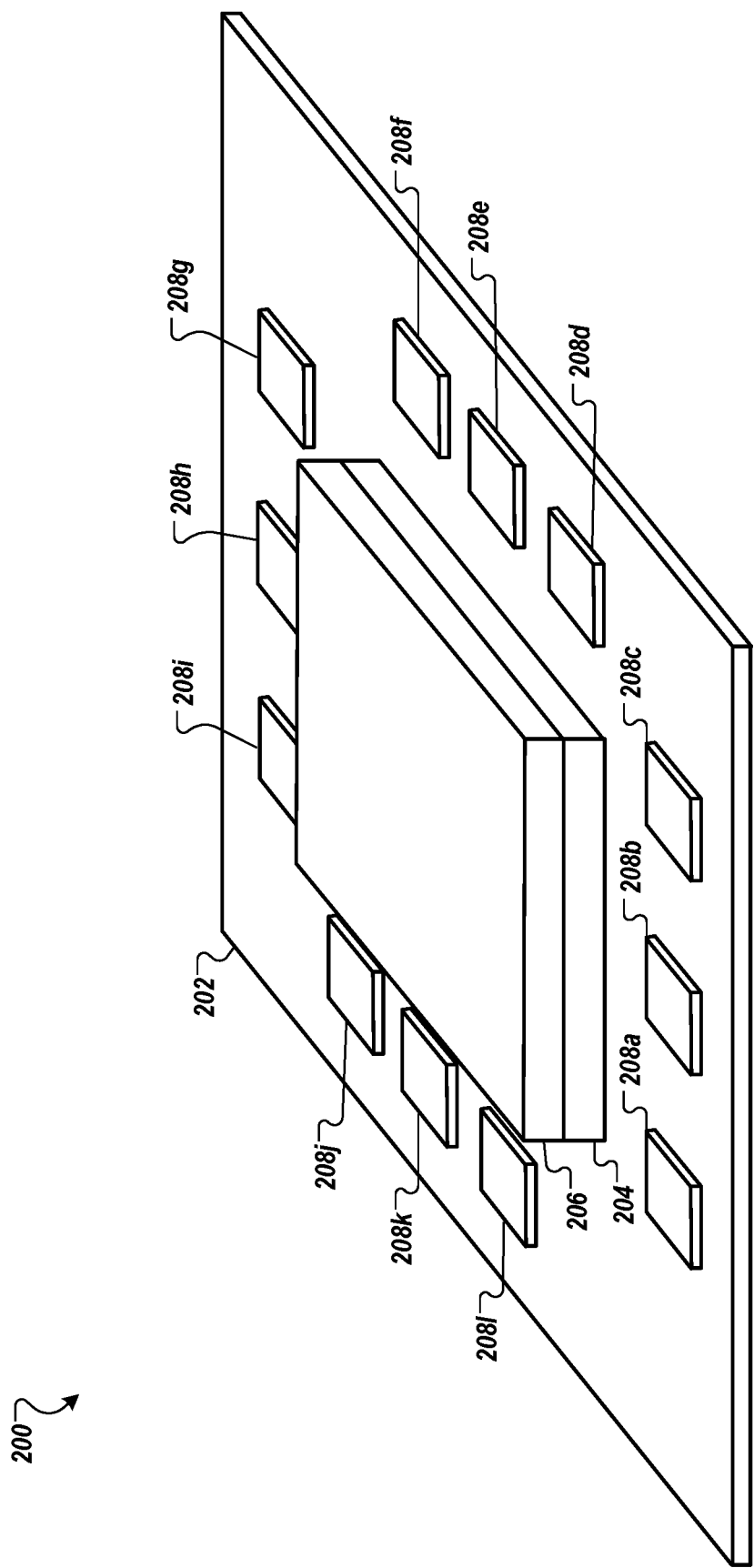
FIG. 2 illustrates an example of an apparatus including a stacked die platform comprising multiple integrated circuits mounted on a substrate, according to at least one embodiment.

FIG. 2 illustrates an example of an apparatus including a stacked die platform comprising multiple integrated circuits mounted on a substrate, according to at least one embodiment. The apparatus includes a stacked die platform 200, which includes a substrate 202, a first integrated circuit 204 disposed on the substrate 202 at a first location, a second integrated circuit 206 disposed on the first integrated circuit 204, and peripheral integrated circuits 208a-1 disposed in various locations on the substrate 202. In at least one embodiment, the substrate 202 may be a common substrate. In at least one embodiment, the stacked die platform 200 may correspond to any appropriate type of device that comprises an integrated circuit. In some embodiments, the stacked die platform 200 may correspond to one or more of a personal computer (PC), a laptop, a tablet, a video processor, a memory chip, a microcontroller, a server, or the like. For example, the first integrated circuit 204 and the second integrated circuit 206 may correspond to a central processing unit (CPU), and the peripheral integrated circuits 208a-1 may correspond to various peripheral devices (e.g., serial interfaces, parallel input-output devices, hardware controllers, etc.).

The first integrated circuit 204 is coupled to one or more of the peripheral integrated circuits 208a-1 using a first chip-to-chip (C2C) interface via a first physical terminal. The second integrated circuit 206 is coupled to the first integrated circuit 204 using a second C2C interface via the first physical terminal. Only one of the first C2C interface and the second C2C interface is active at a time.

In at least one embodiment, one or more peripheral integrated circuits 208a-1 may be coupled to the first integrated circuit 204 and the second integrated circuit 206 using a third C2C interface via the physical terminal. In other embodiments, the one or more of the peripheral integrated circuits 208a-1 may additionally be coupled to the first integrated circuit 204 and the second integrated circuit 206 using a third C2C interface via the physical terminal and a fourth C2C interface via the physical terminal. The fourth C2C interface is a redundant C2C interface.

In at least one embodiment, the first integrated circuit 204 may be coupled to the same or other peripheral integrated circuits 208a-1 using one or more additional C2C interfaces via one or more additional physical terminals. Additionally, the second integrated circuit 206 may be coupled to the first integrated circuit 204 using one or more additional C2C interfaces via the one or more additional physical terminals. For example, the first integrated circuit 204 may be coupled to one or more of the peripheral integrated circuits 208a-1 using the first C2C interface via the first physical terminal and a third C2C interface via a second physical terminal. The second integrated circuit 206 may be coupled to the first integrated circuit 204 using the second C2C interface via the first physical terminal and a fourth C2C interface via the second physical terminal.

Figure 4:
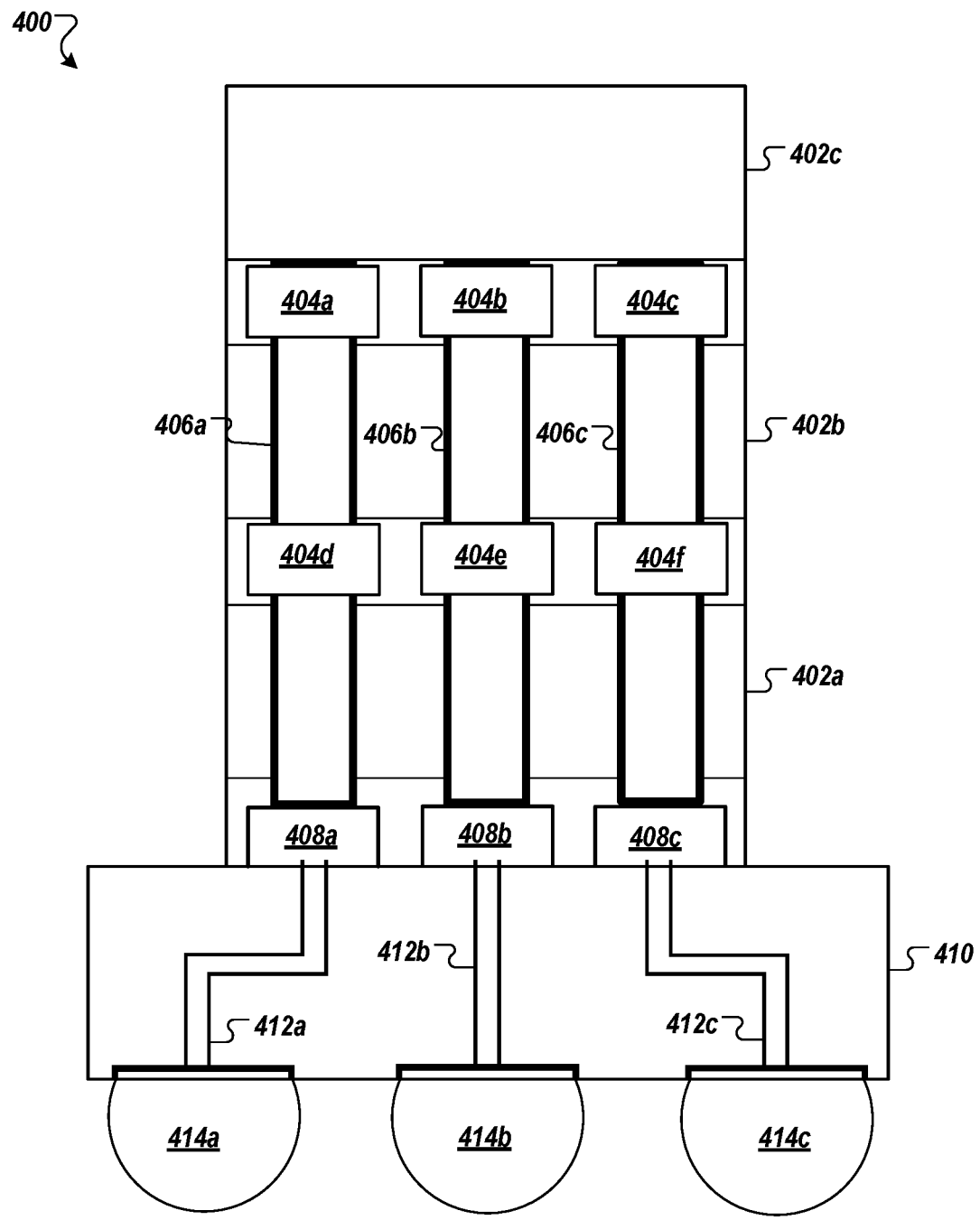
FIG. 4 illustrates an example of a stacked die platform with stacked dies connected to solder bumps using TSVs, according to at least one embodiment.

In at least one embodiment, the C2C interfaces of the second integrated circuit 206 may be connected to the physical terminals via one or more through-silicon vias (TSVs). For example, FIG. 4 illustrates an exemplary embodiment that includes TSVs and will be described in more detail below.

In at least one embodiment, the first integrated circuit 204 and the second integrated circuit 206 may be manufactured to be substantially the same or with only minor differences. For example, the top of the first integrated circuit 204 or the bottom of the second integrated circuit 206 may comprise one or more metal plates to facilitate the connection of the C2C interfaces of the second integrated circuit 206 to one or more physical terminals. In some embodiments, one or more metal plates can be used to facilitate the connection of the C2C interfaces of the second integrated circuit 206 to the one or more physical terminals via one or more TSVs (described below).

In at least one embodiment, the substrate 202 may be a silicon interposer. The silicon interposer may include physical terminals to electrically connect to integrated circuits or other electronic elements. Multiple physical terminals may be electrically connected to each other to enable the connection between different integrated circuits or other electronic elements. In embodiments, the physical terminals may be made up of solder bumps located on a first side of the first integrated circuit 204.

In at least one embodiment, the first integrated circuit 204 and the second integrated circuit 206 are stacked integrated circuits, and the peripheral integrated circuits 208a-1 are single dies or tile dies disposed on the silicon interposer corresponding to one or more peripheral devices. One or more additional integrated circuits (not illustrated) may be disposed on top of one or more of the peripheral integrated circuits 208a-1. The second integrated circuit 206 and the one or more additional integrated circuits may be stacked integrated circuits on the silicon interposer.

In at least one embodiment, one or more additional integrated circuits (not illustrated) may be disposed on top of the second integrated circuit 206. The one or more additional integrated circuits may be coupled to each other using one or more additional C2C interfaces via physical terminals. The one or more additional C2C interfaces may be coupled to the physical terminals via one or more TSVs (described below).

In at least one embodiment, one or more additional integrated circuits (not illustrated) may be disposed on top of one or more of the peripheral integrated circuits 208a-1. The one or more additional integrated circuits may be coupled to each other using one or more additional C2C interfaces via physical terminals. The one or more additional C2C interfaces may be coupled to the physical terminals via one or more TSVs (described below).

In at least one embodiment, one or more additional integrated circuits may be disposed on a different location on the substrate 202. For example, a first additional integrated circuit may be disposed on a different location on the substrate 202, and a second additional integrated circuit may be disposed on top of the first additional integrated circuit. The additional integrated circuits may be connected to the first integrated circuit 204 and the second integrated circuit 206 via the physical terminal.

Figure 3A:
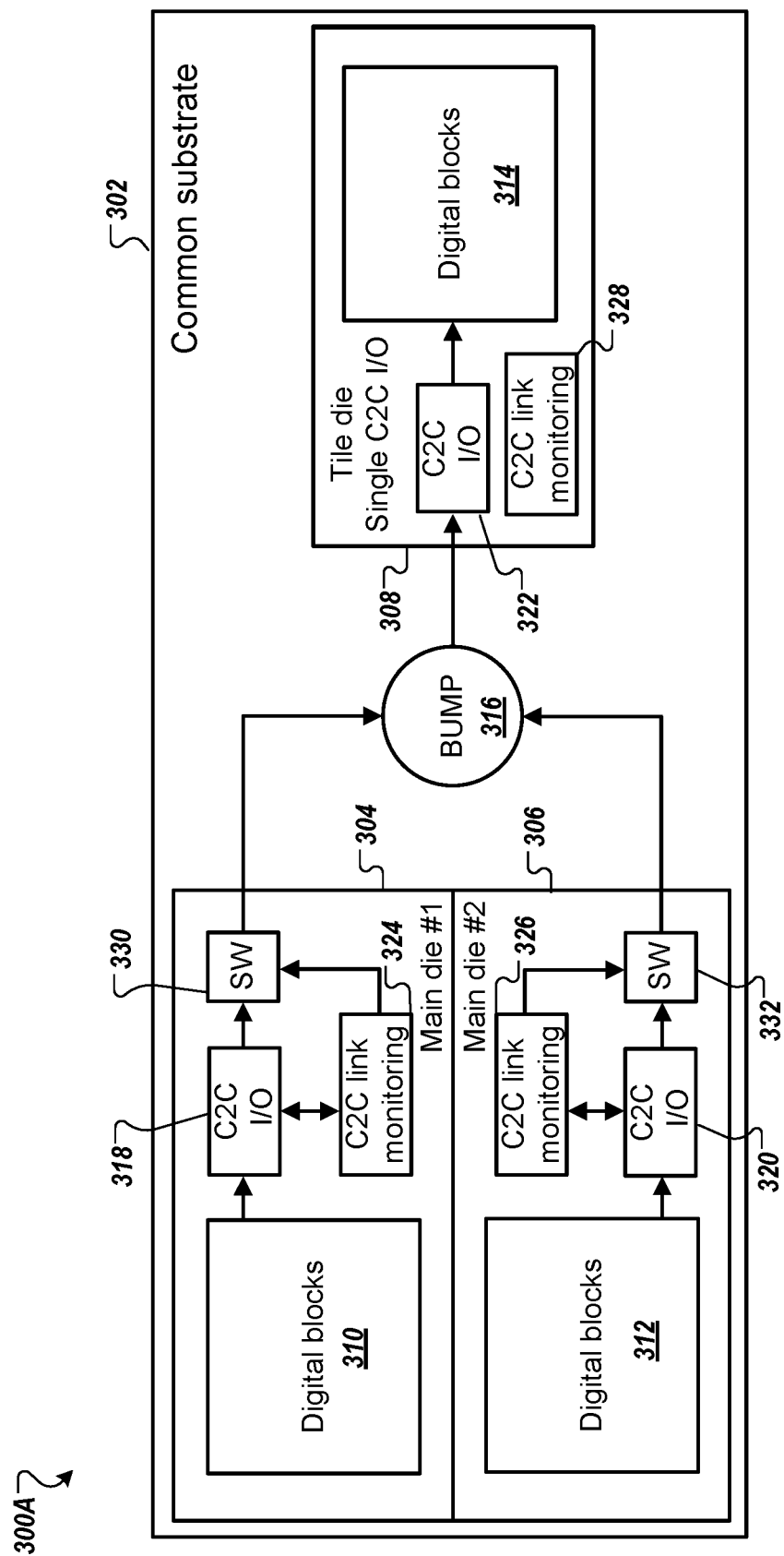
FIG. 3A is a block diagram illustrating the operations of an apparatus including a stacked die platform with redundancy only in the main dies, according to at least one embodiment.

FIG. 3A is a block diagram illustrating the operations of an apparatus including a stacked die platform with redundancy only in the main dies, according to at least one embodiment. The block diagram illustrates an apparatus including a stacked die platform 300A, which includes a substrate 302 that comprises a first integrated circuit 304 and a second integrated circuit 306. In at least one embodiment, the substrate 302 may be a common substrate. The substrate 302 also comprises a peripheral integrated circuit 308 and a physical terminal 316. The first integrated circuit 304 is coupled to a peripheral integrated circuit 308 using a first C2C interface via a physical terminal 316. The first C2C interface includes a first C2C I/O 318 and a first switch 330. The first switch 330 is coupled to the physical terminal 316. The second integrated circuit 306 is coupled to the first integrated circuit 304 using a second C2C interface via the physical terminal 316. The second C2C interface includes a second C2C I/O 320 and a second switch 332. The second switch 332 is coupled to the physical terminal 316. Only one of the first C2C I/O 318 of the first C2C interface and the second C2C I/O 320 of the second C2C interface is active at a time.

In at least one embodiment, the first switch 330 may couple the first C2C I/O 318 to the physical terminal 316 when the first C2C I/O 318 is active. The second switch 332 may couple the second C2C I/O 320 to the physical terminal 316 when the second C2C I/O 320 is active. The first integrated circuit 304 may further include a first C2C link monitoring logic 324 coupled to the first switch 330 and the first C2C I/O 318. The first C2C link monitoring logic 324 may control the first switch 330 when the first C2C I/O 318 is to be made active or inactive. The second integrated circuit 306 may further include a second C2C link monitoring logic 326 coupled to the second switch 332 and the second C2C I/O 320. The second C2C link monitoring logic 326 may control the second switch 332 when the second C2C I/O 320 is to be made active or inactive. In at least one embodiment, the peripheral integrated circuit 308 may couple to the first integrated circuit 304 and the second integrated circuit 306 via the physical terminal 316 via a third C2C interface. The third C2C interface may include a third C2C I/O 322. The peripheral integrated circuit 308 may include a third C2C link monitoring logic 328 to monitor input and output via the third C2C I/O 322. In at least one embodiment, the first integrated circuit 304 may include first digital blocks 310 coupled to the first C2C I/O 318, the second integrated circuit 306 may include second digital blocks 312 coupled to the second C2C I/O 320, and the peripheral integrated circuit 308 may include third digital blocks 314 coupled to the third C2C I/O 322. The first digital blocks 310, the second digital blocks 312, and the third digital blocks 314 may be capable of performing various computing operations (e.g., logic gates, memory functions, etc.).

In an exemplary embodiment, the first C2C I/O 318 may be active initially, and the second C2C I/O 320 may be inactive initially. The first C2C I/O 318 may communicate signals from the first digital blocks 310, through the first C2C I/O 318 and the third C2C I/O 322, and into the third digital blocks 314. During operation, the first C2C link monitoring logic 324 and/or the second C2C link monitoring logic 326 may observe failed communication through the first C2C I/O 318. In response to the failed communication, the first C2C link monitoring logic 324 may cause the first switch 330 to be turned off, and the second C2C link monitoring logic 326 may cause the second switch 332 to be turned on. This may disable any communication from the first C2C I/O 318 and enable communication from the second C2C I/O 320. Once the first switch 330 is turned off and the second switch 332 is turned on, communication from the second digital blocks 312 through the second C2C I/O 320 and the third C2C I/O 322 and into the third digital blocks 314 is enabled. This provides redundancy between the first integrated circuit 304 and the second integrated circuit 306.

In at least one embodiment, the substrate 302 may be a silicon interposer. The silicon interposer may include physical terminals, including physical terminal 316, to connect to integrated circuits or other electronic elements. The physical terminals may be made up of solder bumps. Multiple physical terminals may be electrically connected to each other to enable the connection between the same or different integrated circuits or other electronic elements.

In at least one embodiment, the first integrated circuit 304 and the second integrated circuit 306 are stacked integrated circuits, and peripheral integrated circuit 308 is a single die or a tile die corresponding to one or more peripheral devices.

In at least one embodiment, the first integrated circuit 304 may be coupled to the peripheral integrated circuit 308 or other peripheral integrated circuits (not illustrated) via one or more additional physical terminals. The second integrated circuit 306 may be coupled to the first integrated circuit 304 using one or more additional C2C interfaces via the one or more additional physical terminals. The peripheral integrated circuit 308 may also be coupled to the first integrated circuit 304 using one or more additional C2C interfaces via the one or more additional physical terminals. For example, the first integrated circuit 304 may be coupled to the peripheral integrated circuit 308 using the first C2C interface via the physical terminal 316 and an additional C2C interface via an additional physical terminal. The second integrated circuit 306 may be coupled to the first integrated circuit 304 using the second C2C interface via the physical terminal 316 and an additional C2C interface via the additional physical terminal. The peripheral integrated circuit 308 may also be coupled to the first integrated circuit 304 using the third C2C interface via the physical terminal 316 and an additional C2C interface via the additional physical terminal.

Figure 3B:
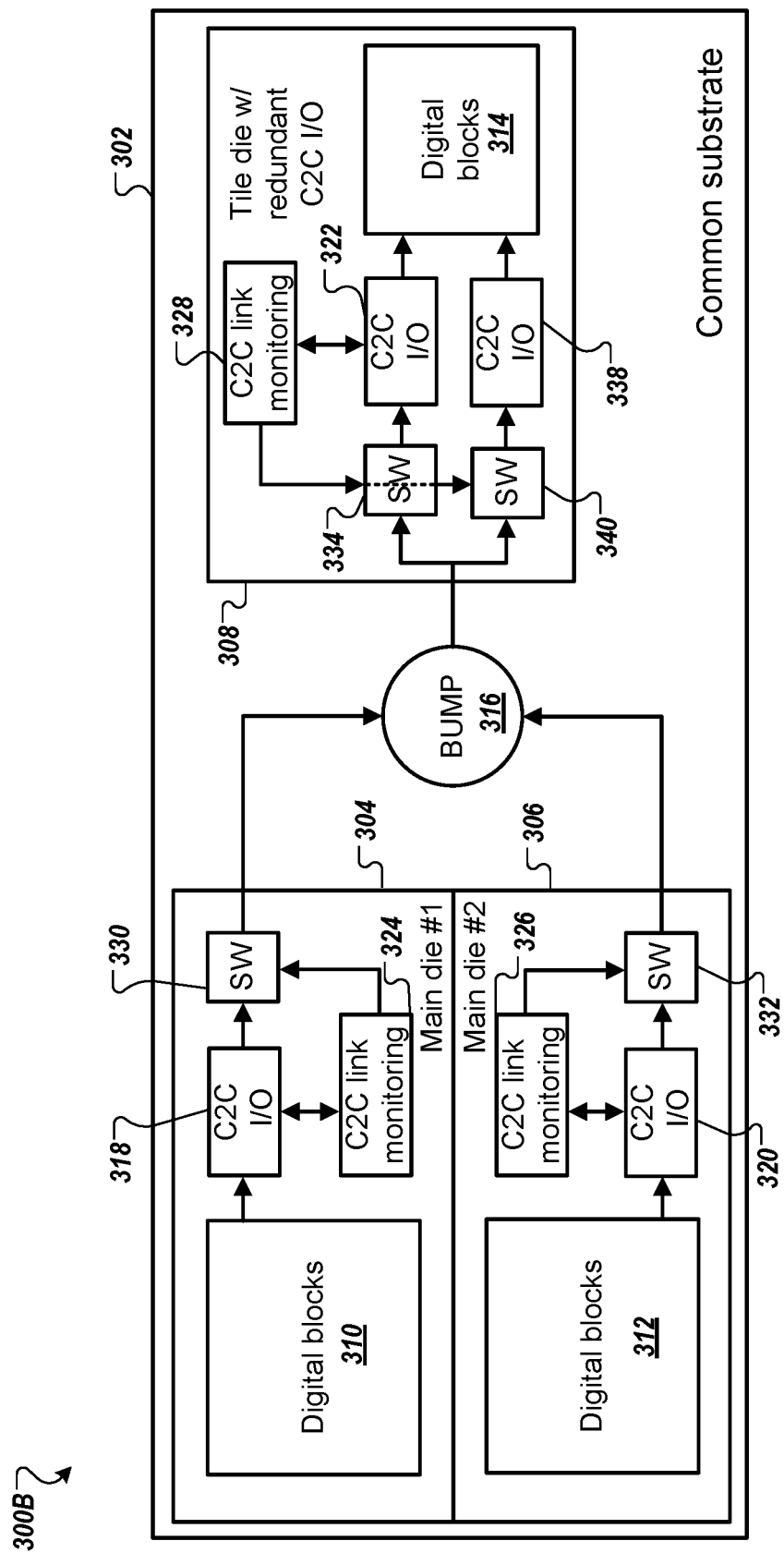
FIG. 3B is a block diagram illustrating the operations of an apparatus including a stacked die platform with redundancy in both the main dies and the tile die, according to at least one embodiment.

FIG. 3B is a block diagram illustrating the operations of an apparatus including a stacked die platform with redundancy in both the main dies and the tile die, according to at least one embodiment. As similarly described above in FIG. 3A, the block diagram illustrates an apparatus including a stacked die platform 300B, which includes a substrate 302 that comprises a first integrated circuit 304 and a second integrated circuit 306. In some embodiments, the substrate 302 may be a common substrate. The substrate 302 also comprises a peripheral integrated circuit 308 and a physical terminal 316. The first integrated circuit 304 is coupled to a peripheral integrated circuit 308 using a first C2C interface via the physical terminal 316. The first C2C interface includes a first C2C I/O 318 and a first switch 330. The first switch 330 is coupled to the physical terminal 316. The second integrated circuit 306 is coupled to the first integrated circuit 304 using a second C2C interface via the physical terminal 316. The second C2C interface includes a second C2C I/O 320 and a second switch 332. The second switch 332 is coupled to the physical terminal 316. Only one of the first C2C I/O 318 of the first C2C interface and the second C2C I/O 320 of the second C2C interface is active at a time.

In at least one embodiment, the first switch 330 may couple the first C2C I/O 318 to the physical terminal 316 when the first C2C I/O 318 is active. The second switch 332 may couple the second C2C I/O 320 to the physical terminal 316 when the second C2C I/O 320 is active. The first integrated circuit 304 may further include a first C2C link monitoring logic 324 coupled to the first switch 330 and the first C2C I/O 318. The first C2C link monitoring logic 324 may control the first switch 330 when the first C2C I/O 318 is to be made active or inactive. The second integrated circuit 306 may further include a second C2C link monitoring logic 326 coupled to the second switch 332 and the second C2C I/O 320. The second C2C link monitoring logic 326 may control the second switch 332 when the second C2C I/O 320 is to be made active or inactive. In some embodiments, the peripheral integrated circuit 308 may couple to the first integrated circuit 304 and the second integrated circuit 306 via the physical terminal 316 via a third C2C interface.

According to at least one embodiment, the third C2C interface may include a third C2C I/O 322, a fourth C2C I/O 338, a third switch 334, a fourth switch 340, and a third C2C link monitoring logic 328. The third switch 334 may be coupled to the physical terminal 316, the third C2C I/O 322, and the third C2C link monitoring logic 328. The fourth switch 340 may be coupled to the physical terminal 316, the fourth C2C I/O 338, and the third C2C link monitoring logic 328. The third switch 334 may couple the third C2C I/O 322 to the physical terminal 316 when the third C2C I/O 322 is active. The fourth switch 340 may couple the fourth C2C I/O 338 to the physical terminal 316 when the fourth C2C I/O 338 is active. The third C2C link monitoring logic 328 may control the third switch 334 based on whether the third C2C I/O 322 is to be active or inactive. The third C2C link monitoring logic 328 may also control the fourth switch 340 based on whether the fourth C2C I/O 338 is active or inactive.

In at least one embodiment, the first integrated circuit 304 may include first digital blocks 310 coupled to the first C2C I/O 318, the second integrated circuit 306 may include second digital blocks 312 coupled to the second C2C I/O 320, and the peripheral integrated circuit 308 may include third digital blocks 314 coupled to the third C2C I/O 322 and the fourth C2C I/O 338. The first digital blocks 310, the second digital blocks 312, and the third digital blocks 314 may be capable of performing various computing operations (e.g., logic gates, memory functions, etc.).

In an exemplary embodiment, the first C2C I/O 318 and the third C2C I/O 322 may initially be active. The second C2C I/O 320 and the fourth C2C I/O 338 may initially be inactive. The first C2C I/O 318 may communicate signals from the first digital blocks 310, through the first C2C I/O 318 and the third C2C I/O 322, and into the third digital blocks 314. During operation, the first C2C link monitoring logic 324, the second C2C link monitoring logic 326, and/or the third C2C link monitoring logic 328 may observe failed communication through the first C2C I/O 318 and the third C2C I/O 322. In response to the failed communication, the first C2C link monitoring logic 324 may cause the first switch 330 to be turned off, the second C2C link monitoring logic 326 may cause the second switch 332 to be turned on, and the third C2C link monitoring logic 328 may cause the third switch 334 to be turned off and the fourth switch 340 to be turned on. This provides redundancy between the first integrated circuit 304 and the second integrated circuit 306, along with redundancy within the peripheral integrated circuit 308.

In at least one embodiment, as described above, the substrate 302 may be a silicon interposer. The silicon interposer may include physical terminals, including the physical terminal 316, to connect to integrated circuits or other electronic elements. The physical terminals may be made up of solder bumps. Multiple physical terminals may be electrically connected to each other to enable the connection between different integrated circuits or other electronic elements.

In at least one embodiment, as described above, the first integrated circuit 304 and the second integrated circuit 306 are stacked integrated circuits, and the peripheral integrated circuit 308 is a single die or a tile die corresponding to one or more peripheral devices.

In at least one embodiment, as described above, the first integrated circuit 304 may be coupled to the peripheral integrated circuit 308 or other peripheral integrated circuits (not illustrated) via one or more additional physical terminals. The second integrated circuit 306 may be coupled to the first integrated circuit 304 using one or more additional C2C interfaces via the one or more additional physical terminals. The peripheral integrated circuit 308 may also be coupled to the first integrated circuit 304 using one or more additional C2C interfaces via the one or more additional physical terminals. For example, the first integrated circuit 304 may be coupled to the peripheral integrated circuit 308 using the first C2C interface via the physical terminal 316 and an additional C2C interface via an additional physical terminal. The second integrated circuit 306 may be coupled to the first integrated circuit 304 using the second C2C interface via the physical terminal 316 and an additional C2C interface via the additional physical terminal. The peripheral integrated circuit 308 may also be coupled to the first integrated circuit 304 using the third C2C interface via the physical terminal 316 and an additional C2C interface via the additional physical terminal.

Figure 3C:
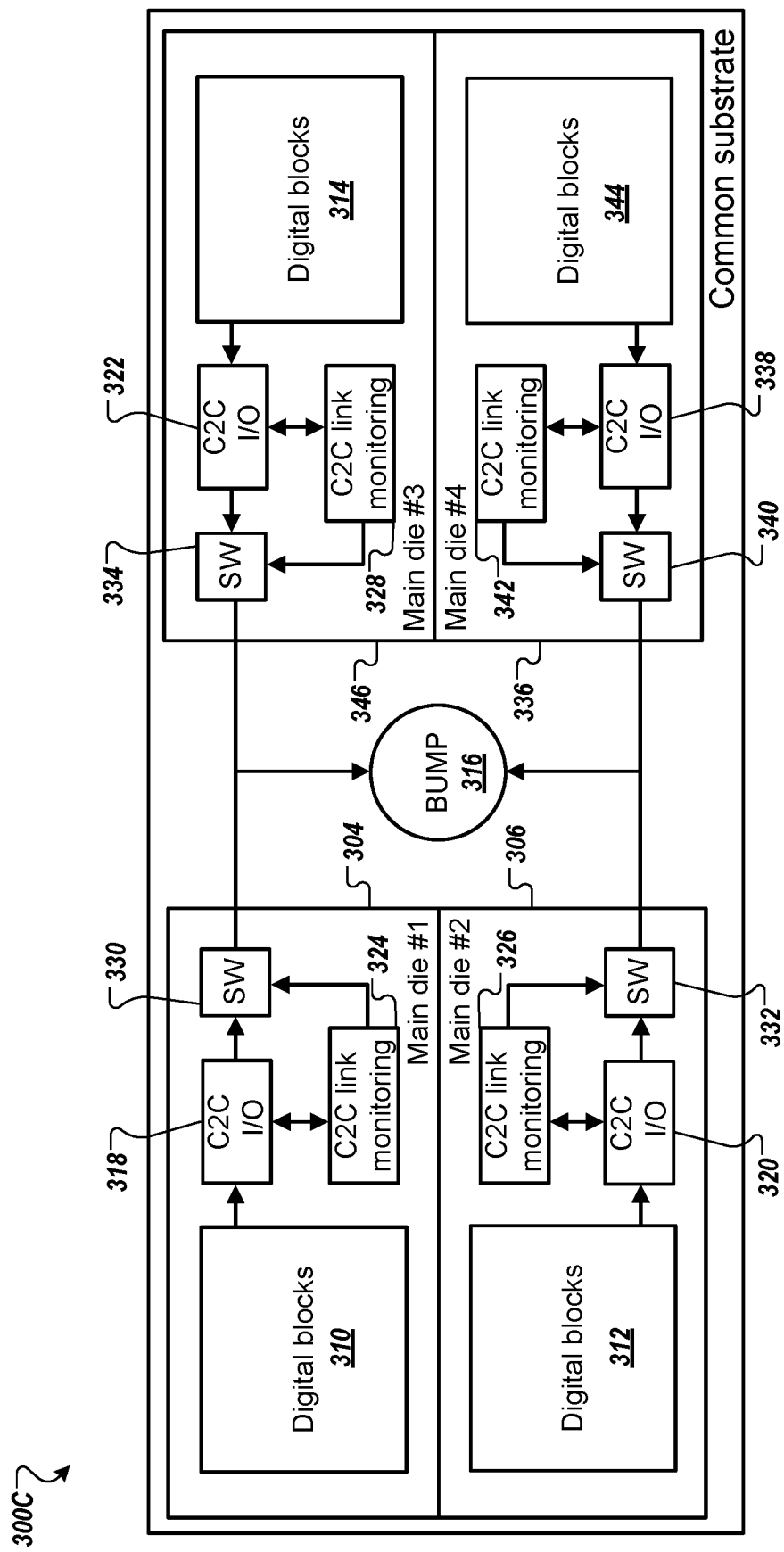
FIG. 3C is a block diagram illustrating the operations of an apparatus including two stacked die platforms connected to the same physical interface, according to at least one embodiment.

FIG. 3C is a block diagram illustrating the operations of an apparatus including two stacked die platforms connected to the same physical interface, according to at least one embodiment. As similarly described above in FIG. 3A, the block diagram illustrates an apparatus including a stacked die platform 300C, which includes a substrate 302 that comprises a first integrated circuit 304, a second integrated circuit 306, and a physical terminal 316. In at least one embodiment, the substrate 302 may be a common substrate. In at least one embodiment, the substrate 302 also comprises a third integrated circuit 346 and a fourth integrated circuit 336. The first integrated circuit 304 is coupled to the third integrated circuit 346 and a physical terminal 316. The first integrated circuit 304 is coupled to the third integrated circuit 346 using a first C2C interface via the physical terminal 316. The first C2C interface includes a first C2C I/O 318 and a first switch 330. The first switch 330 is coupled to the physical terminal 316. The second integrated circuit 306 is coupled to the first integrated circuit 304 using a second C2C interface via the physical terminal 316. The second C2C interface includes a second C2C I/O 320 and a second switch 332. The second switch 332 is coupled to physical terminal 316. Only one of the first C2C I/O 318 of the first C2C interface and the second C2C I/O 320 of the second C2C interface is active at a time.

In at least one embodiment, the third integrated circuit 346 is coupled to the first integrated circuit 304 using a third C2C interface via the physical terminal 316. The third C2C interface includes a third C2C I/O 322 and a third switch 334. The third switch 334 is coupled to the physical terminal 316. The fourth integrated circuit 336 is coupled to the third integrated circuit 346 using a fourth C2C interface via the physical terminal 316. The fourth C2C interface includes a fourth C2C I/O 338 and a fourth switch 340. The fourth switch 340 is coupled to the physical terminal 316. Only one of the third C2C I/O 322 of the third C2C interface and the fourth C2C I/O 338 of the fourth C2C interface is active at a time.

In at least one embodiment, the first switch 330 may couple the first C2C I/O 318 to physical terminal 316 when the first C2C I/O 318 is active. The second switch 332 may couple the second C2C I/O 320 to the physical terminal 316 when the second C2C I/O 320 is active. The third switch 334 may couple the third C2C I/O 322 to the physical terminal 316 when the third C2C I/O 322 is active. The fourth switch 340 may couple the fourth C2C I/O 338 to the physical terminal 316 when the fourth C2C I/O 338 is active.

In at least one embodiment, the first integrated circuit 304 may further include the first C2C link monitoring logic 324 coupled to the first switch 330 and the first C2C I/O 318. The first C2C link monitoring logic 324 may control the first switch 330 when the first C2C I/O 318 is to be made active or inactive. The second integrated circuit 306 may further include a second C2C link monitoring logic 326 coupled to the second switch 332 and the second C2C I/O 320. The second C2C link monitoring logic 326 may control the second switch 332 when the second C2C I/O 320 is to be made active or inactive.

In at least one embodiment, the third integrated circuit 346 may further include a third C2C link monitoring logic 328 coupled to the third switch 334 and the third C2C I/O 322. The third C2C link monitoring logic 328 may control the third switch 334 when the third C2C I/O 322 is to be made active or inactive. The fourth integrated circuit 336 may further include a fourth C2C link monitoring logic 342 coupled to the fourth switch 340 and the fourth C2C I/O 338. The fourth C2C link monitoring logic 342 may control the fourth switch 340 when the fourth C2C I/O 338 is to be made active or inactive.

In at least one embodiment, the first integrated circuit 304 may include first digital blocks 310 coupled to the first C2C I/O 318, the second integrated circuit 306 may include second digital blocks 312 coupled to the second C2C I/O 320, the third integrated circuit 346 may include third digital blocks 314 coupled to the third C2C I/O 322, and the fourth integrated circuit 336 may include fourth digital blocks 344 coupled to the fourth C2C I/O 338. The first digital blocks 310, the second digital blocks 312, the third digital blocks 314, and the fourth digital blocks 344 may be capable of performing various computing operations (e.g., logic gates, memory functions, etc.).

In an exemplary embodiment, the first C2C I/O 318 and the third C2C I/O 322 may initially be active. The second C2C I/O 320 and the fourth C2C I/O 338 may initially be inactive. The first C2C I/O 318 may communicate signals from the first digital blocks 310, through the first C2C I/O 318 and the third C2C I/O 322, and into the third digital blocks 314 or vice versa. During operation, the first C2C link monitoring logic 324, the second C2C link monitoring logic 326, the third C2C link monitoring logic 328, and/or the fourth C2C link monitoring logic 342 may observe failed communication through the first C2C I/O 318 and the third C2C I/O 322. In response to the failed communication, the first C2C link monitoring logic 324 may cause the first switch 330 to be turned off, the second C2C link monitoring logic 326 may cause the second switch 332 to be turned on, the third C2C link monitoring logic 328 may cause the third switch 334 to be turned off, and the fourth C2C link monitoring logic 342 may cause the fourth switch 340 to be turned on. This provides redundancy between the first integrated circuit 304 and the second integrated circuit 306. This also provides redundancy within the third integrated circuit 346 and the fourth integrated circuit 336.

In at least one embodiment, as described above, the substrate 302 may be a silicon interposer. The silicon interposer may include physical terminals, including the physical terminal 316, to connect to integrated circuits or other electronic elements. The physical terminals may be made up of solder bumps. Multiple physical terminals may be electrically connected to each other to enable the connection between different integrated circuits or other electronic elements.

In at least one embodiment, the first integrated circuit 304, the second integrated circuit 306, the third integrated circuit 346, and the fourth integrated circuit 336 are stacked integrated circuits.

In at least one embodiment, as described above, the first integrated circuit 304 may be coupled to the third integrated circuit 346 or additional peripheral integrated circuits (not illustrated) via one or more additional physical terminals. The second integrated circuit 306 may be coupled to the first integrated circuit 304 using one or more additional C2C interfaces via the one or more additional physical terminals. The third integrated circuit 346 may also be coupled to the first integrated circuit 304 using one or more additional C2C interfaces via the one or more additional physical terminals. The fourth integrated circuit 336 may be coupled to the third integrated circuit 346 using one or more additional C2C interfaces via the one or more additional physical terminals. For example, the first integrated circuit 304 may be coupled to the third integrated circuit 346 using the first C2C interface via the physical terminal 316 and an additional C2C interface via an additional physical terminal. The second integrated circuit 306 may be coupled to the first integrated circuit 304 using the second C2C interface via the physical terminal 316 and an additional C2C interface via the additional physical terminal. The third integrated circuit 346 may be coupled to the first integrated circuit 304 using the third C2C interface via the physical terminal 316 and an additional C2C interface via the additional physical terminal. The fourth integrated circuit 336 may be coupled to the third integrated circuit 346 using the fourth C2C interface via the physical terminal 316 and an additional C2C interface via the additional physical terminal.

FIG. 4 illustrates an example of a stacked die platform with stacked dies connected to solder bumps using TSVs, according to at least one embodiment. In an exemplary embodiment, the stacked die platform 400 includes a first die 402a, a second die 402b, and a third die 402c. The bottom of the first die 402a includes a first flip-chip bump 408a, a second flip-chip bump 408b, and a third flip-chip bump 408c. The bottom of second die 402b includes a fourth micro-bump 404d, a fifth micro-bump 404e, and a sixth micro-bump 404f. The bottom of the third die 402c includes a first micro-bump 404a, a second micro-bump 404b, and a third micro-bump 404c. The stacked die platform 400 further includes a first TSV 406a, a second TSV 406b, and a third TSV 406c. The first TSV 406a couples the first micro-bump 404a, the fourth micro-bump 404d, and the first flip-chip bump 408a. The second TSV 406b couples the second micro-bump 404b, the fifth micro-bump 404e, and the second flip-chip bump 408b. The third TSV 406c couples the third micro-bump 404c, the sixth micro-bump 404f, and the third flip-chip bump 408c. When the first TSV 406a, the second TSV 406b, and the third TSV 406c are each connected to their respective micro-bumps and flip-chip bumps, they extend from the third die 402c, through the second die 402b, and through the first die 402a. The first flip-chip bump 408a is coupled to the substrate 410 and a first electrical connection 412a. The first electrical connection 412a extends through the substrate 410 and couples to a first solder bump 414a. The second flip-chip bump 408b is coupled to the substrate 410 and a second electrical connection 412b. The second electrical connection 412b extends through the substrate 410 and couples to a second solder bump 414b. The third flip-chip bump 408c is coupled to the substrate 410 and a third electrical connection 412c. The third electrical connection 412c extends through the substrate 410 and couples to a third solder bump 414c.

As described above, in at least one embodiment, the C2C interfaces of the integrated circuits (e.g., the second integrated circuit 206, the second integrated circuit 306) may be connected to the physical terminals (e.g., the physical terminal 316) via one or more TSVs. For example, the first die 402a may represent the first integrated circuit 204, and the second die 402b may represent the second integrated circuit 206. The substrate 402 may represent the substrate 202, and the first solder bump 414a may represent the physical terminal of FIG. 2. As described above in FIG. 2, the first integrated circuit 204 may be connected to the substrate 202 via one or more physical terminals. The second integrated circuit 206 may be connected to the one or more physical terminals via one or more TSVs as currently described in FIG. 4. In some embodiments, if one or more additional dies are added on top of the package (as described in FIGS. 2 and 3A-C), the one or more TSVs can be extended through the stacked dies into the topmost die.

In an exemplary embodiment, the first die 402a, the second die 402b, and the third die 402c may include integrated circuitry similar to those described in FIGS. 3A-C. The first die 402a, the second die 402b, and the third die 402c may each include one or more digital blocks, C2C I/Os, C2C link monitoring logic, and/or switches. For example, the first die 402a may include one or more digital blocks, a C2C I/O, C2C link monitoring logic, and/or a switch coupled to the flip-chip bump 408a. Similar circuitry may be connected to the flip-chip bump 408b and the flip-chip bump 408c. The second die 402b and the third die 402c may also have similar circuitry connected to the micro-bumps 404a-f. This arrangement may facilitate redundancy between the first die 402a, the second die 402b, and the third die 402c.

In at least one embodiment, the stacked die platform 400 may include additional dies stacked on top of the third die 402c or placed at a different location on the substrate 410. The additional dies may be a single die, multiple dies, tile dies, stacked dies, or any other types of die. The first die 402a, the second die 402b, and the third die 402c may be coupled to additional micro-bumps, flip-chip bumps, and/or TSVs. The substrate 410 may include additional solder bumps and additional electrical connections to facilitate additional connections between the first die 402a, the second die 402b, the third die 402c, or any additional die or device that needs an electrical connection to the substrate. For example, any arrangement, such as those described in FIGS. 2 and 3A-C, may be implemented using the exemplary electrical connections as implemented in stacked die platform 400.

Other variations are within the spirit of the present disclosure. Thus, while disclosed techniques are susceptible to various modifications and alternative constructions, certain illustrated embodiments thereof are shown in drawings and have been described above in detail. It should be understood, however, that there is no intention to limit the disclosure to a specific form or forms disclosed, but on the contrary, the intention is to cover all modifications, alternative constructions, and equivalents falling within the spirit and scope of the disclosure, as defined in appended claims.

Use of terms "a" and "an" and "the" and similar referents in the context of describing disclosed embodiments (especially in the context of following claims) are to be construed to cover both singular and plural, unless otherwise indicated herein or clearly contradicted by context, and not as a definition of a term. Terms "comprising," "having," "including," and "containing" are to be construed as open-ended terms (meaning "including, but not limited to,") unless otherwise noted. "Connected," when unmodified and referring to physical connections, is to be construed as partly or wholly contained within, attached to, or joined together, even if there is something intervening. Recitations of ranges of values herein are merely intended to serve as a shorthand method of referring individually to each separate value falling within the range, unless otherwise indicated herein, and each separate value is incorporated into the specification as if it were individually recited herein. In at least one embodiment, the use of the term "set" (e.g., "a set of items") or "subset" unless otherwise noted or contradicted by context, is to be construed as a nonempty collection comprising one or more members. Further, unless otherwise noted or contradicted by context, the term "subset" of a corresponding set does not necessarily denote a proper subset of the corresponding set, but subset and corresponding set may be equal.

Conjunctive language, such as phrases of the form "at least one of A, B, and C," or "at least one of A, B and C," unless specifically stated otherwise or otherwise clearly contradicted by context, is otherwise understood with the context as used in general to present that an item, term, etc., may be either A or B or C, or any nonempty subset of the set of A and B and C. For instance, in an illustrative example of a set having three members, conjunctive phrases "at least one of A, B, and C" and "at least one of A, B, and C" refer to any of the following sets: {A}, {B}, {C}, {A, B}, {A, C}, {B, C}, {A, B, C}. Thus, such conjunctive language is not generally intended to imply that certain embodiments require at least one of A, at least one of B, and at least one of C each to be present. In addition, unless otherwise noted or contradicted by context, the term "plurality" indicates a state of being plural (e.g., "a plurality of items" indicates multiple items). In at least one embodiment, the number of items in a plurality is at least two, but can be more when so indicated either explicitly or by context. Further, unless stated otherwise or otherwise clear from context, the phrase "based on" means "based at least in part on" and not "based solely on."

Operations of processes described herein can be performed in any suitable order unless otherwise indicated herein or otherwise clearly contradicted by context. In at least one embodiment, a process such as those processes described herein (or variations and/or combinations thereof) is performed under the control of one or more computer systems configured with executable instructions and is implemented as code (e.g., executable instructions, one or more computer programs or one or more applications) executing collectively on one or more processors, by hardware or combinations thereof. In at least one embodiment, code is stored on a computer-readable storage medium, for example, in the form of a computer program comprising a plurality of instructions executable by one or more processors. In at least one embodiment, a computer-readable storage medium is a non-transitory computer-readable storage medium that excludes transitory signals (e.g., a propagating transient electric or electromagnetic transmission) but includes non-transitory data storage circuitry (e.g., buffers, cache, and queues) within transceivers of transitory signals. In at least one embodiment, code (e.g., executable code or source code) is stored on a set of one or more non-transitory computer-readable storage media having stored thereon executable instructions (or other memory to store executable instructions) that, when executed (i.e., as a result of being executed) by one or more processors of a computer system, cause a computer system to perform operations described herein. In at least one embodiment, a set of non-transitory computer-readable storage media comprises multiple non-transitory computer-readable storage media and one or more individual non-transitory storage media of multiple non-transitory computer-readable storage media lack all of the code while multiple non-transitory computer-readable storage media collectively store all of the code. In at least one embodiment, executable instructions are executed such that different instructions are executed by different processors.

Accordingly, in at least one embodiment, computer systems are configured to implement one or more services that singly or collectively perform operations of processes described herein and such computer systems are configured with applicable hardware and/or software that enable the performance of operations. Further, a computer system that implements at least one embodiment of present disclosure is a single device and, in another embodiment, is a distributed computer system comprising multiple devices that operate differently such that distributed computer system performs operations described herein and such that a single device does not perform all operations.

Use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

All references, including publications, patent applications, and patents, cited herein are hereby incorporated by reference to the same extent as if each reference were individually and specifically indicated to be incorporated by reference and were set forth in its entirety herein.

In description and claims, the terms "coupled" and "connected," along with their derivatives, may be used. It should be understood that these terms may not be intended as synonyms for each other. Rather, in particular examples, "connected" or "coupled" may be used to indicate that two or more elements are in direct or indirect physical or electrical contact with each other. "Coupled" may also mean that two or more elements are not in direct contact with each other, but yet still co-operate or interact with each other.

Unless specifically stated otherwise, it may be appreciated that throughout specification terms such as "processing," "computing," "calculating," "determining," or like, refer to action and/or processes of a computer or computing system, or similar electronic computing device, that manipulates and/or transforms data represented as physical, such as electronic, quantities within computing system's registers and/or memories into other data similarly represented as physical quantities within computing system's memories, registers or other such information storage, transmission or display devices.

In a similar manner, the term "processor" may refer to any device or portion of a device that processes electronic data from registers and/or memory and transform that electronic data into other electronic data that may be stored in registers and/or memory. As a non-limiting example, a "processor" may be a network device. A "computing platform" may comprise one or more processors. As used herein, "software" processes may include, for example, software and/or hardware entities that perform work over time, such as tasks, threads, and intelligent agents. Also, each process may refer to multiple processes for continuously or intermittently carrying out instructions in sequence or parallel. In at least one embodiment, the terms "system" and "method" are used herein interchangeably insofar as the system may embody one or more methods, and methods may be considered a system.

In the present document, references may be made to obtaining, acquiring, receiving, or inputting analog or digital data into a subsystem, computer system, or computer-implemented machine. In at least one embodiment, the process of obtaining, acquiring, receiving, or inputting analog and digital data can be accomplished in a variety of ways, such as by receiving data as a parameter of a function call or a call to an application programming interface. In at least one embodiment, processes of obtaining, acquiring, receiving, or inputting analog or digital data can be accomplished by transferring data via a serial or parallel interface. In at least one embodiment, processes of obtaining, acquiring, receiving, or inputting analog or digital data can be accomplished by transferring data via a computer network from providing entity to acquiring entity. In at least one embodiment, references may also be made to providing, outputting, transmitting, sending, or presenting analog or digital data. In various examples, processes of providing, outputting, transmitting, sending, or presenting analog or digital data can be accomplished by transferring data as an input or output parameter of a function call, a parameter of an application programming interface, or an inter-process communication mechanism.

Although descriptions herein set forth exemplary embodiments of described techniques, other architectures may be used to implement described functionality, and are intended to be within the scope of this disclosure. Furthermore, although specific distributions of responsibilities may be defined above for purposes of description, various functions and responsibilities might be distributed and divided in different ways, depending on circumstances.

Furthermore, although the subject matter has been described in language specific to structural features and/or methodological acts, it is to be understood that subject matter claimed in appended claims is not necessarily limited to specific features or acts described. Rather, specific features and acts are disclosed as exemplary forms of implementing the claims.

What is claimed is:

1. An apparatus, comprising:
a substrate;
a first integrated circuit disposed on the substrate at a first location;
a second integrated circuit disposed on the substrate at a second location, wherein the second integrated circuit is coupled to the first integrated circuit using a first chip-to-chip (C2C) interface via a physical terminal; and
a third integrated circuit disposed on the second integrated circuit, wherein the third integrated circuit is coupled to the first integrated circuit using a second C2C interface via the physical terminal, wherein only one of the first C2C interface and the second C2C interface is active at a time, wherein:
the second integrated circuit comprises a first switch coupled to the first C2C interface and the physical terminal, wherein the first switch is to couple the first C2C interface to the physical terminal when the first C2C interface is active; and
the third integrated circuit comprises a second switch coupled to the second C2C interface and the physical terminal, wherein the second switch is to couple the second C2C interface to the physical terminal when the second C2C interface is active.

2. The apparatus of claim 1, wherein:
the second integrated circuit further comprises first C2C link monitoring logic coupled to the first switch and the first C2C interface, wherein the first C2C link monitoring logic is to control the first switch when the first C2C interface is active; and
the third integrated circuit further comprises second C2C link monitoring logic coupled to the second switch and the second C2C interface, wherein the second C2C link monitoring logic is to control the second switch when the second C2C interface is active.

3. The apparatus of claim 1, wherein the substrate is a silicon interposer, wherein the first integrated circuit and the second integrated circuit are stacked integrated circuits on the silicon interposer, and wherein the physical terminal is a bump on a first side of the second integrated circuit.

4. The apparatus of claim 3, wherein the first integrated circuit is a single die disposed on the silicon interposer.

5. The apparatus of claim 3, further comprising a fourth integrated circuit disposed on the first integrated circuit, wherein the third integrated circuit and the fourth integrated circuit are stacked integrated circuits on the silicon interposer.

6. The apparatus of claim 1, wherein the first integrated circuit is coupled to the second integrated circuit and the third integrated circuit using a third C2C interface via the physical terminal.

7. The apparatus of claim 1, wherein the first integrated circuit is coupled to the second integrated circuit and the third integrated circuit using a third C2C interface via the physical terminal and a fourth C2C interface via the physical terminal, wherein the fourth C2C interface is a redundant C2C interface.

8. The apparatus of claim 7, wherein the first integrated circuit comprises:
a third switch coupled to the third C2C interface and the physical terminal, wherein the third switch is to couple the third C2C interface to the physical terminal when the third C2C interface is active; and
a fourth switch coupled to the fourth C2C interface and the physical terminal, wherein the fourth switch is to couple the fourth C2C interface to the physical terminal when the fourth C2C interface is active.

9. The apparatus of claim 8, wherein the first integrated circuit further comprises:
third C2C link monitoring logic coupled to the third switch and the third C2C interface, wherein the third C2C link monitoring logic is to control the third switch when the third C2C interface is active; and
fourth C2C link monitoring logic coupled to the fourth switch and the fourth C2C interface, wherein the fourth C2C link monitoring logic is to control the fourth switch when the fourth C2C interface is active.

10. A stacked die platform comprising:
a common substrate; and
stacked dies coupled to the common substrate using a set of bumps, wherein the stacked dies comprise:
a first die comprising a first input-output (I/O) circuit and a first switch; and
a second die comprising a second I/O circuit and a second switch, wherein the first switch and the second switch are coupled to a first bump of the set of bumps, and wherein only one of the first I/O circuit and the second I/O circuit is active at a time.

11. The stacked die platform of claim 10, further comprising a die coupled to the common substrate, the die comprising a third I/O circuit coupled to the first I/O circuit or the second I/O circuit via the first bump.

12. The stacked die platform of claim 10, further comprising a die coupled to the common substrate, the die comprising:
a third I/O circuit and a third switch, wherein the third switch is coupled to the first bump; and
a fourth I/O circuit and a fourth switch, wherein the fourth switch is coupled to the first bump, wherein only one of the third I/O circuit and the fourth I/O circuit is active at a time.

13. The stacked die platform of claim 10, wherein:
the first die further comprises first C2C link monitoring logic coupled to the first switch and the first I/O circuit, wherein the first C2C link monitoring logic is to control the first switch when the first I/O circuit is active; and
the second die further comprises second C2C link monitoring logic coupled to the second switch and the second I/O circuit, wherein the second C2C link monitoring logic is to control the second switch when the second I/O circuit is active.

14. The stacked die platform of claim 13, further comprising a die coupled to the common substrate, the die comprising:
a third I/O circuit coupled to the first I/O circuit or the second I/O circuit via the first bump; and
C2C link monitoring logic coupled to the third I/O circuit.

15. The stacked die platform of claim 13, further comprising a die coupled to the common substrate, the die comprising:
a third I/O circuit, third C2C link monitoring logic, and a third switch, wherein the third switch is coupled to the first bump, wherein the third C2C link monitoring logic is coupled to the third switch and the third I/O circuit, wherein the third C2C link monitoring logic is to control the third switch when the third I/O circuit is active; and a fourth I/O circuit, fourth C2C link monitoring logic, and a fourth switch, wherein the fourth switch is coupled to the first bump, wherein the fourth C2C link monitoring logic is coupled to the fourth switch and the fourth I/O circuit, wherein the fourth C2C link monitoring logic is to control the fourth switch when the fourth I/O circuit is active, and wherein only one of the third I/O circuit and the fourth I/O circuit is active at a time.

16. A stacked die platform comprising:

a common substrate; and stacked dies coupled to the common substrate using a set of bumps, wherein the stacked dies comprise:
- a first die comprising a first input-output (I/O) circuit and a first switch; and
- a second die comprising a second I/O circuit and a second switch, wherein the first switch and the second switch are coupled to a first bump of the set of bumps, and wherein only one of the first I/O circuit and the second I/O circuit is active at a time; and a third die coupled to the common substrate, the third die comprising:
- a third I/O circuit and a third switch; and
- a fourth I/O circuit and a fourth switch, and wherein only one of the third I/O circuit and the fourth I/O circuit is active at a time.

17. The stacked die platform of claim 16, wherein:

the first die further comprises first C2C link monitoring logic coupled to the first switch and the first I/O circuit, wherein the first C2C link monitoring logic is to control the first switch when the first I/O circuit is active;

the second die further comprises second C2C link monitoring logic coupled to the second switch and the second I/O circuit, wherein the second C2C link monitoring logic is to control the second switch when the second I/O circuit is active; and the third die further comprises:
third C2C link monitoring logic coupled to the third switch, the third I/O circuit, the fourth switch, and the fourth I/O circuit, wherein the third C2C link monitoring logic is to control the third switch when the third I/O circuit is active and control the fourth switch when the fourth I/O circuit is active.

18. The stacked die platform of claim 16, wherein the common substrate is a silicon interposer, wherein the stacked dies are stacked on the silicon interposer, and wherein the set of bumps is located on a first side of the first die, wherein the second die is coupled to the first die.

19. The stacked die platform of claim 18, wherein the third die is a single die disposed on the silicon interposer.

* * * * *